United States Patent [19]

Kernevez et al.

[11] Patent Number: 5,414,357
[45] Date of Patent: May 9, 1995

[54] NMR MAGNETOMETER PROBE HAVING A SINGLE RESONATOR AND A SINGLE RADICAL SOLUTION

[75] Inventors: Nelly Kernevez; Henri Glenat, both of Corenc, France

[73] Assignee: Commissariat a L'Energie Atomique, Paris, France

[21] Appl. No.: 111,004

[22] Filed: Aug. 24, 1993

[30] Foreign Application Priority Data

Sep. 7, 1992 [FR] France .................. 92 10634

[51] Int. Cl.⁶ .................................................. G01V 3/00
[52] U.S. Cl. ................................. 324/301; 324/300
[58] Field of Search ............... 324/300, 301, 302, 316, 324/318, 322

[56] References Cited

U.S. PATENT DOCUMENTS

| | | | |
|---|---|---|---|
| 4,114,087 | 9/1978 | Fry | 324/301 |
| 4,260,949 | 4/1981 | Dalton, Jr. | 324/302 |
| 4,734,645 | 3/1988 | Glendt et al. | 324/301 |
| 4,891,592 | 1/1990 | Verdier | 324/301 |
| 5,187,438 | 2/1993 | Alcouffe et al. | 324/301 |
| 5,198,767 | 3/1993 | Glenat et al. | 324/301 |

FOREIGN PATENT DOCUMENTS 0206931 12/1986 European Pat. Off. .
0296005 12/1988 European Pat. Off. .
0451054 10/1991 European Pat. Off. .
2098624 3/1972 France .

Primary Examiner—Louis Arana
Attorney, Agent, or Firm—Oblon, Spivak, McClelland, Maier & Neustadt

[57] ABSTRACT

A NMR magnetometer probe having a single resonator and a single radical solution. A single bottle contains the single radical solution. Further, a single resonator is tuned to one of the electric resonance frequencies of the solution. Such an NMR magnetometer probe may find particular application to the measurement of magnetic fields.

6 Claims, 5 Drawing Sheets

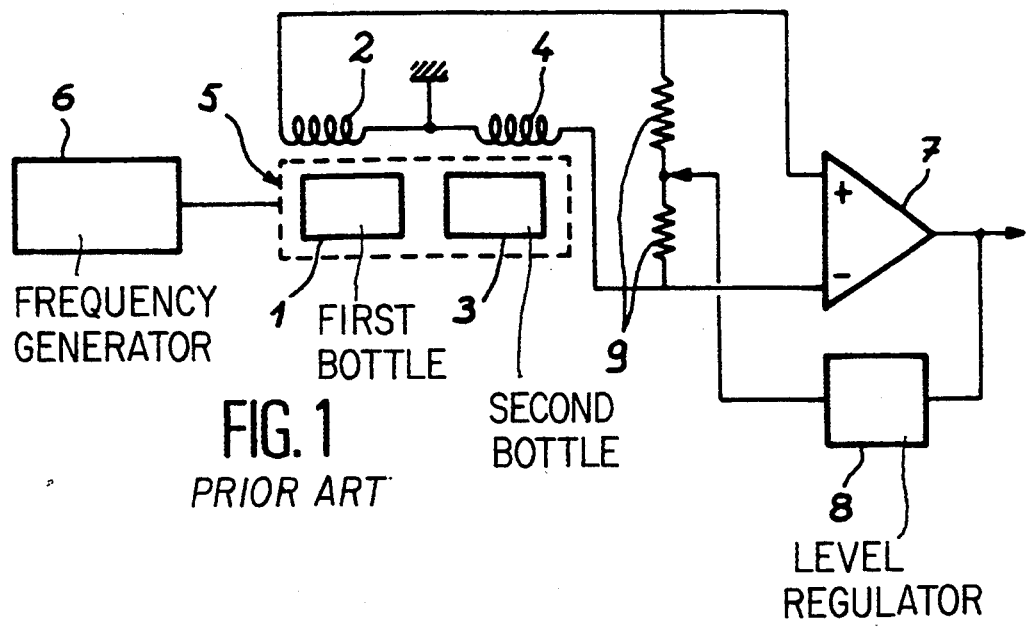
FIG. 1 *PRIOR ART*
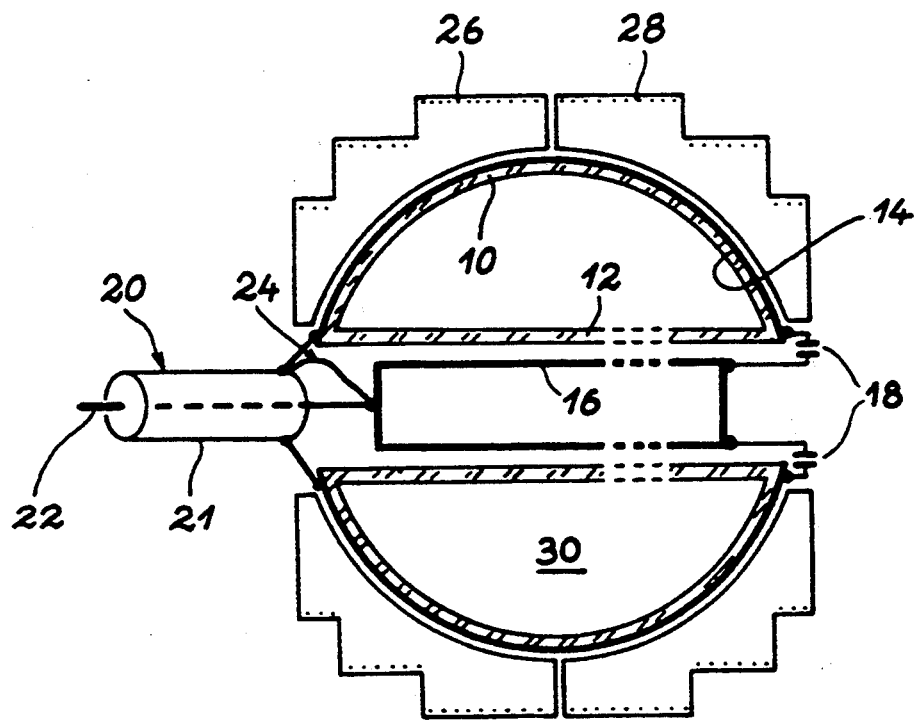
FIG. 2

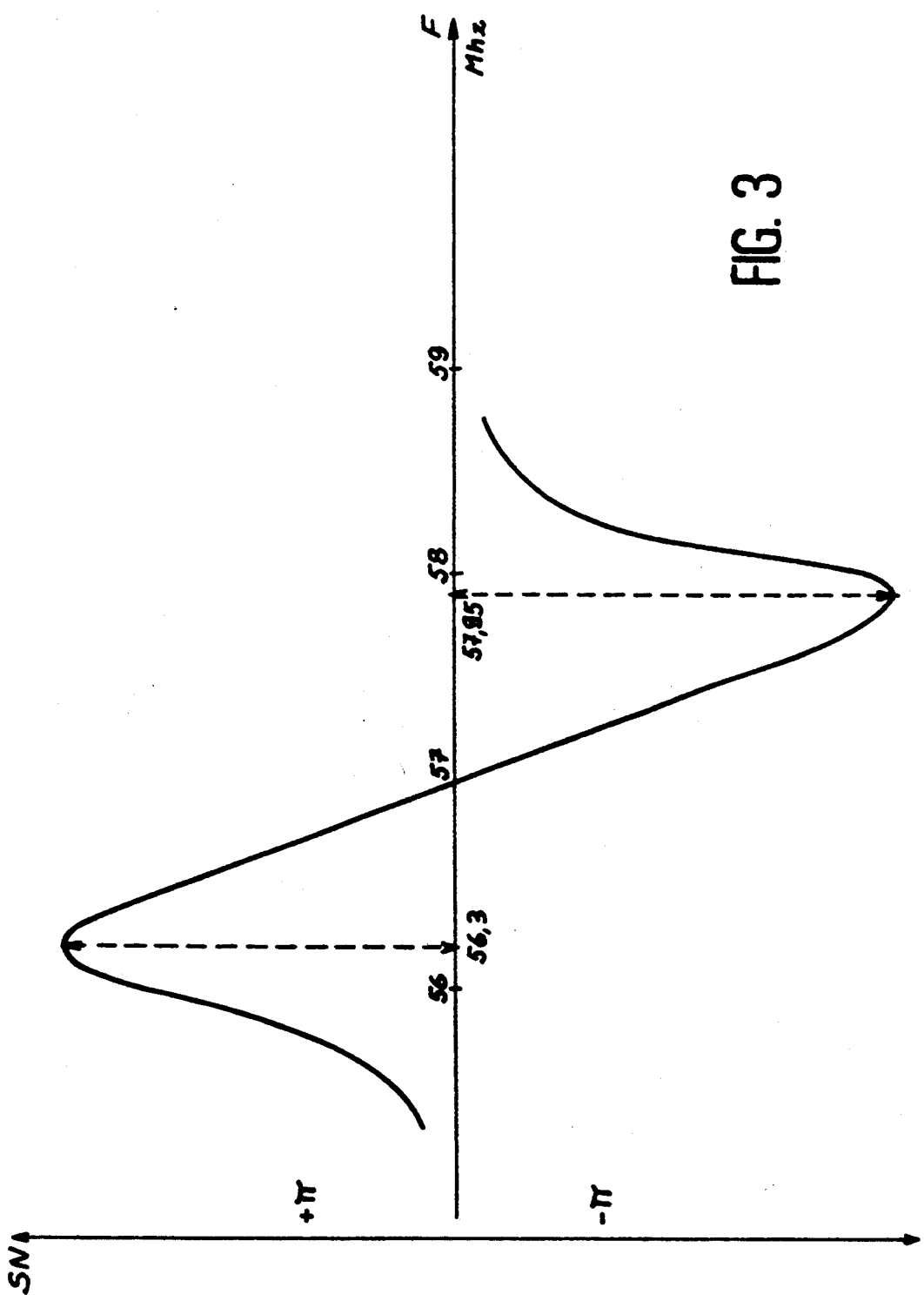

NMR MAGNETOMETER PROBE HAVING A SINGLE RESONATOR AND A SINGLE RADICAL SOLUTION

FIELD OF THE INVENTION

The present invention relates to a nuclear magnetic resonance (NMR) magnetometer probe having a single resonator and a single radical solution. It is used in the precise measurement of magnetic fields and in particular the earth's magnetic field.

DISCUSSION OF THE BACKGROUND

The probe according to the invention is of a known type, e.g. described in French patent applications FR-A-1 447 226 and FR-A-2 098 624. The operating principle of these probes will now be briefly described.

When a liquid sample, whose atomic nuclei have a magnetic moment and a kinetic moment of a non-zero nature, is exposed to a magnetic field, the nuclear magnetic moments tend to be aligned parallel or anti-parallel to the field. The energy difference between these two states defines a nuclear resonance energy or a nuclear resonance frequency, which generally falls within the low frequency range of approximately 1000 Hertz.

However, with the standard fields, the total nuclear polarization (positive or negative) of the sample remains low and difficult to detect.

The OVERHAUSER-ABRAGAM effect makes it possible to significantly increase this polarization. To this end, an appropriate paramagnetic substance is dissolved in a solvent, the substance being chosen so as to have an unpaired electron giving rise to an excited electron level having a hyperfine structure with four sublevels. Generally, the pumping frequency making it possible to raise the substance to one of these electron sublevels is in the high frequency range of a few dozen megahertz.

The dipolar coupling between the electron spin of the thus excited paramagnetic substance and the nuclear spin of the solvent significantly increases the polarization of the latter. In accordance with the excited electron transition, the positive nuclear polarization or the negative nuclear polarization of the solvent is favored.

This procedure is further improved by using a "double effect". A first radical solution (i.e. a solvent with a paramagnetic substance) is subject to a high frequency, which saturates the electron level favoring the positive polarization of the solvent, whereas a second radical solution is subject to a high frequency, which saturates the electron level favoring the negative polarization of the solvent.

In the first case, an excitation signal at the nuclear resonance frequency applied to the sample will be absorbed by the latter, whereas in the second case, an excitation signal at the same frequency will cause a stimulated emission at the resonance frequency. Sampling windings connected in series-opposition and placed around the first and second solutions will then supply voltages of the same frequency, but of opposite phases. A connection to a differential amplifier will make it possible to form the sum thereof. All the spurious signals induced in these windings and which the same phase will be cancelled out.

Such a double effect probe can function with two different solutions and a single excitation frequency, provided that the absorption spectra of the two solutions are reciprocally displaced in such a way that the single frequency corresponds to the positive polarization for one and the negative polarization for the other.

However, a double effect probe can also function with the same solution distributed into two samples and by applying to the two samples two different frequencies, in order to separately saturate the two sublevels of the paramagnetic substance.

Finally, by a final improvement, the signal supplied by the probe, which is at the nuclear resonance frequency, can be reinjected as the excitation signal of the samples into a loop or ring connection, which then functions as an oscillator. A probe of the "spin coupling oscillator type" is then obtained. The probe according to the invention belongs to this type.

Thus, the attached FIG. 1 shows a probe incorporating a first bottle 1 with a positive polarization and with its low frequency winding 2, a second bottle 3 having negative polarization with its low frequency winding 4, a single high frequency resonator 5 surrounding the two bottles and a high frequency generator 6 supplying the resonator. The two windings 2 and 4 are connected in series-opposition and are connected to the positive and negative inputs of a differential amplifier 7, whose output is relooped, by means of a level regulator 8, on the low frequency windings, looping taking place across a resistive balancing bridge 9.

The frequency of the signal supplied by such an oscillator is equal to the nuclear resonance frequency, which is directly proportional to the ambient magnetic field, the proportionality factor being equal to the gyromagnetic ratio of the atomic nuclei.

Numerous embodiments of such probes have been described in the two documents referred to hereinbefore, as well as FR-A-2 583 887 and FR-A-2 610 760.

SUMMARY OF THE INVENTION

Although satisfactory in certain respects, such probes suffer from the disadvantage of being complex due to the duplication of the means used, namely a double resonator and/or a double radical solution.

The present invention aims at obviating this disadvantage. To this end, it recommends the use of a probe only having a single resonator and a single radical solution having the OVERHAUSER-ABRAGAM effect. A priori, for the expert, such a probe should not function because, due to the symmetry of a probe with a resonator and a solution, the voltages induced in the two windings connected to the different amplifier should cancel one another out completely in such a way that no signal should be available at the amplifier output. However, as explained hereinbefore, in a resonator having an axis of revolution with, along the axis, two bottles containing different samples, the dynamic polarization phenomenon is established in a homogeneous manner along the axis. Only the polarization signal changes with the solutions used. It will be positive for one and negative for the other. Thus, the two bottles create voltages induced in opposite directions in the two windings surrounding them and the differential amplifier forming the difference therefrom will supply a double signal.

However, this interpretation on the part of the expert, has probably only been of an approximate nature, because it is not perfectly in accordance with experience. The best interpretation based on experience consists of assuming that the polarization phenomenon is not homogeneously established in the solution. It would appear to occur in a privileged manner at the ends of the bottle. At present, the applicant is unable to explain in theory this unexpected phenomenon. However, the fact is that the dynamic polarization is not homogeneous in volume and is more intense at one end of the bottle than the other. Consequently, in a probe having a single bottle containing a single radical solution, the total signal supplied by the differential amplifier will not be zero, contrary to all expectations and this is due to the asymmetry. This has been established by the applicant. The radical solution used has at least one electronic resonance. It can have one or two at two frequencies or more than two.

Therefore the probe according to the invention is particularly simple with its single bottle and its single radical solution. This uniqueness of the sample gives the probe a better behavior in the presence of a magnetic field gradient compared with probes having two samples. The probe according to the invention is also simplified by the use of a single resonator. The temperature behavior thereof is improved and its consumption reduced.

Thus, the cost of the probe according to the invention is lower. Moreover, it only requires a single high frequency generator. However, the simplicity has a reverse side.

The probe according to the invention has a low sensitivity, a reduced signal amplitude and a relatively poor isotropy. Moreover, the probe may be sensitive to external interference as a function of the connection of the coils. When the probe coils are assembled in a series-series manner, the differential amplifier cannot then reject the intercepted noise and the probe is sensitive to external interference. The sensitivity to interference could be limited by a shield.

When the coils are connected in series-opposition, as in the prior art probes, the probe is said to be anti-noise and is then insensitive to external interference. However, for such a connection type, the signal amplitude is well below that of the series-series connection and the probe has a forbidden axis. It does not function when its axis is colinear to the field to be measured.

Thus, the application fields of the invention are those where low cost apparatuses are required, in a relatively undisturbed electromagnetic environment or in environments where the probe can be oriented in a favorable, given direction. This can be a marine medium, oil wells, etc.

BRIEF DESCRIPTION OF THE DRAWINGS

FIG. 1, already described, shows a prior art magnetometer probe.

FIG. 2 shows in section a probe according to the invention.

FIG. 3 shows an example of a nuclear signal spectrum as a function of the frequency saturating the electronic levels.

DETAILED DESCRIPTION OF AN EMBODIMENT

Figure 4A:
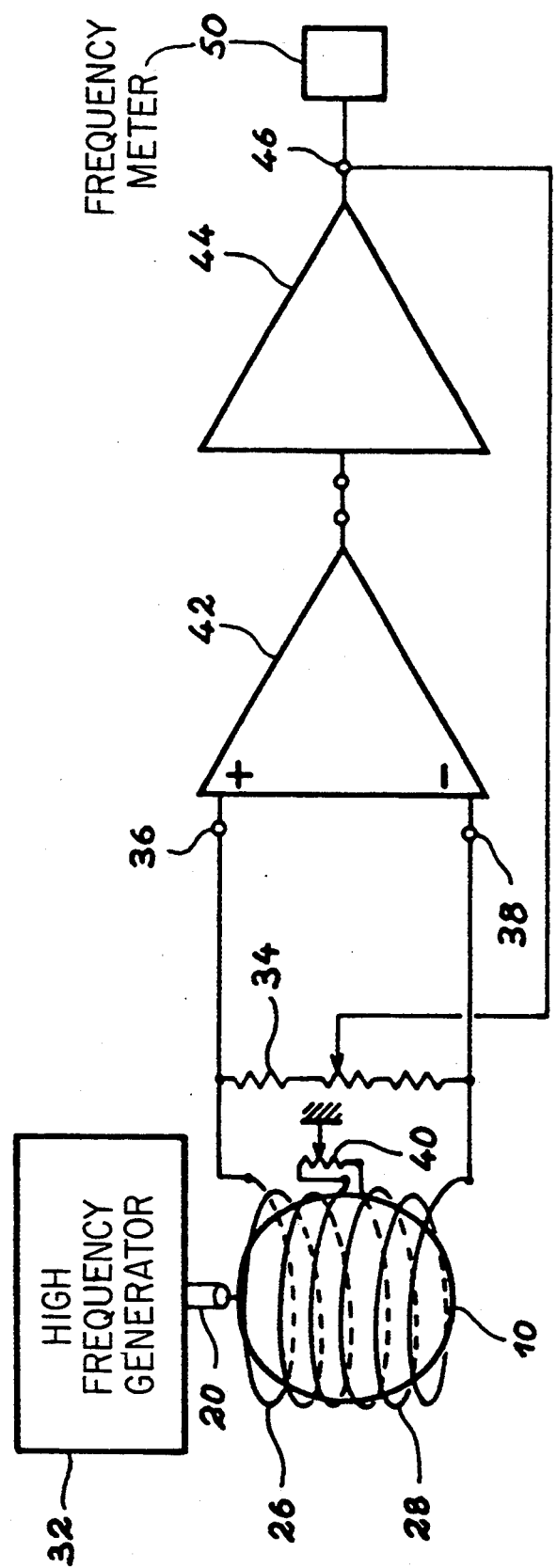
FIGS. 4a and 4b show the connections of a probe and its amplifiers in the case of a series-series connection of the coils (4a) and in the case of a series-opposition connection of the coils (4b).

The probe shown in FIG. 2 comprises an e.g. pyrex bottle 10 having a spherical shape (but it would also be possible to have a conical, cylindrical or other shape). A central, pyrex tube 12 is placed on the axis of the probe. The spherical bottle 10 is externally covered by a conductive layer 14, e.g. a silver-containing paint annealed at 550° C. This layer cannot be continuous and is instead divided into e.g. 1 to 8 sectors to avoid the formation of eddy currents during the displacement of the probe in the field to be measured. The central tube 12 contains a hollow conductive cylinder 16, e.g. made from silver, which is the central core of the resonator and which is connected to the spherical conductive surface 14 by a magnetic capacitors 18. These capacitors are regulatable in order to make it possible to regulate the frequency of the thus formed coaxial resonator.

This resonator is connected to a coaxial cable 20, e.g. of impedance 50 ohms, formed by an external conductor 21 and a central conductor 22. The external conductor 21 is connected to the external conductor 14 of the resonator and the central conductor 22 is connected to the central core 16. A loop 24 permits an adaptation of the resonator to the impedance of the cable (e.g. 50 ohms) by connecting the external conductor 21 of the cable to the central core 16.

The resonator is completely surrounded by two windings 26, 28, which internally are shaped like a spherical cup and externally have the shape of stairs (the slightly active areas having been eliminated in order to obviate an excessive weight). The two windings 26, 28 have an identical shape and are positioned symmetrically with respect to the median plane of the probe and are connected in series, namely either in series-series, or series-opposition manner.

The bottle 10 contains a single radical solution 30, which is of any known type in this application. Reference can e.g. be made to deuterated TANO 15N dissolved in a mixture of dimethoxyethane (DME) and water or in methanol or in tetrahydrofuran.

For example, FIG. 3 shows the nuclear signal SN obtained on the basis of a TANO 15ND solution in tetrahydrofuran as a function of the electronic excitation frequency F. It is possible to see two resonances corresponding to the two conventional transitions, one corresponding to a positive polarization and the other to a negative polarization, in other words one to a positive phase nuclear signal and the other to a negative phase nuclear signal. In the considered example, the two frequencies are respectively at 56.3 and 57.95 MHz. According to the invention, the resonator is tuned to one of these two frequencies.

FIG. 4a shows the electronic means associated with the probe which has just been described. There is a single spherical bottle 10 forming a resonator with its conductive surface and the central core, the resonator being connected by the coaxial cable 20 to a high frequency generator 32. There are also two symmetrical windings 26, 28 serving both for the excitation and for the detection of the nuclear signal. They are electrically connected in series and the connection of the coils is such that the windings turn in the same direction when assembled on the probe.

Figure 4B:
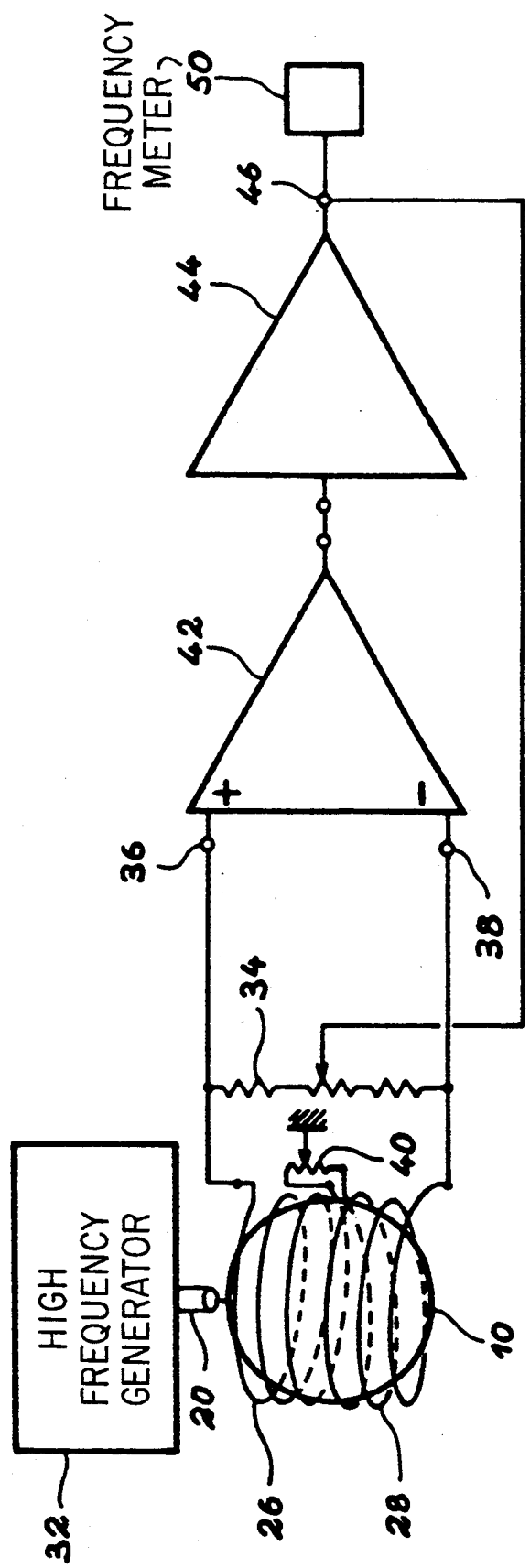

The variant according to FIG. 4b corresponds to a connection of the coils in series-series opposition. They are electrically connected in series, but the windings turn in the opposite direction. All the other elements of FIG. 4b are identical to those of FIG. 4a.

The two windings 26 and 28 are connected to a potentiometer 34 making it possible to regulate to the same value the amplitudes of the voltages appearing at points 36 and 38. Advantageously, a second potentiometer 40 makes it possible to adjust the phase deviations resulting from design variations of the coils.

The two points 36 and 38 are connected to the direct and reverse inputs of a differential amplifier 42, which can be followed by a second amplifier 44, whose output 46 is relooped onto the potentiometer 34. The signal present at the output 46 is the signal whose frequency makes it possible to determine the value of the ambient magnetic field. A frequency meter 50 gives the value thereof.

Figure 5:
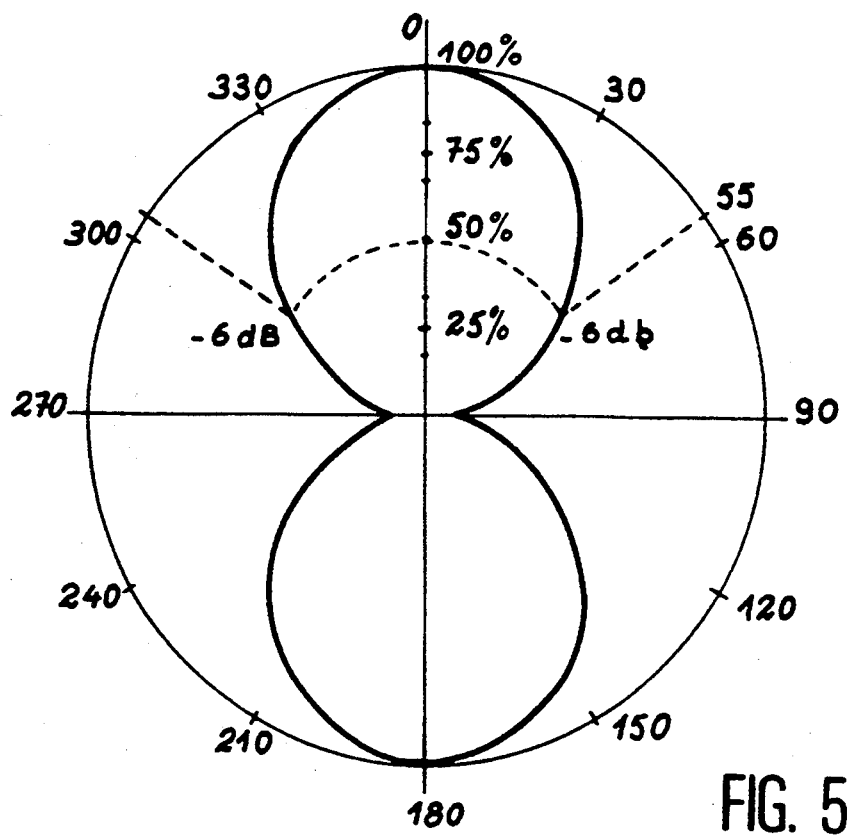
FIG. 5 shows an amplitude anisotropy curve of a probe connected in series-series manner, i.e. the variation of the voltage supplied by the probe in the rotation of its axis in a plane where it passes from a colinear orientation to an orientation perpendicular to the earth's field.

As indicated hereinbefore, the great simplicity of the probe according to the invention is in part counteracted by a certain anisotropy. In this connection FIG. 5 shows the variation of the electrical signal supplied as a function of the probe orientation relative to an ambient magnetic field. The signal is at a maximum when the probe is perpendicular to the field (angle 0 and 180°) and at a minimum when parallel thereto (angle 90 and 270°).

Figure 6:
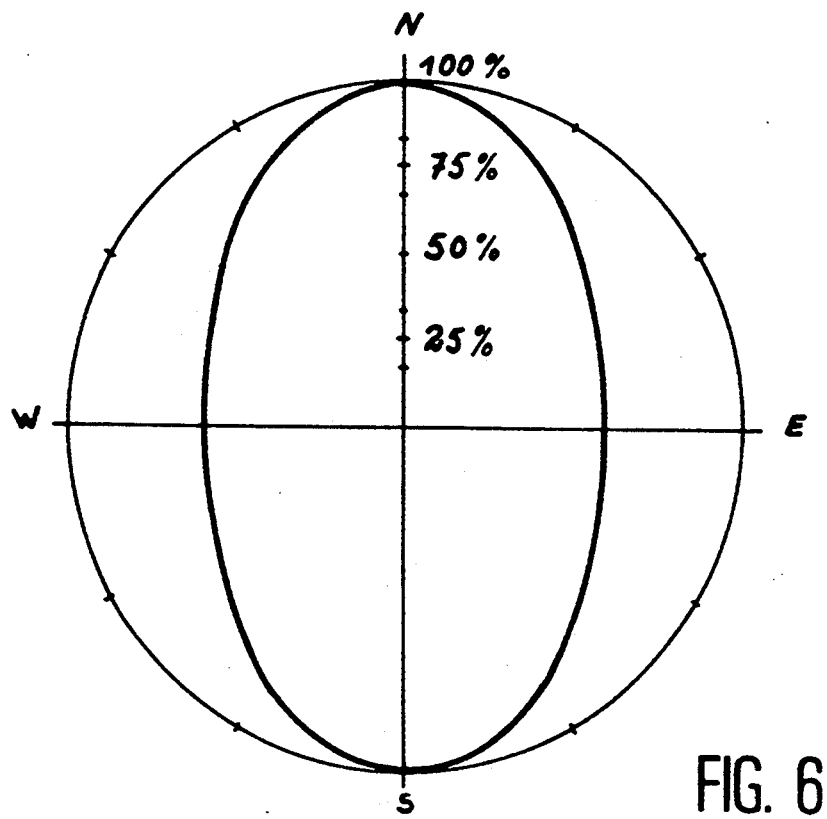
FIG. 6 shows another amplitude anisotropy curve of a probe connected in series-series manner, i.e. the variation of the voltage supplied in a rotation of the axis in a horizontal plane.

FIG. 6 shows the variation of the signal supplied by the probe during a rotation of the probe direction in the plane which is horizontal at our latitudes, i.e. for an inclination of the earth's field of 62° with respect to the horizontal. The amplitude variation between the north-south or east-west orientations of the probe is approximately 40%.

When the probe is assembled in series-opposition, which is the variant corresponding to FIG. 4b, the anisotropy is even greater. The probe does not even operate when its axis is parallel to the field to be measured.

This anisotropy is not redhibitory. Thus, there are numerous applications where the probe can be used in a fixed direction. Bearing in mind the knowledge of its anisotropy, the probe will be positioned in the orientation giving it the signal max/mum. The applications aimed at for this probe are those requiring a low cost rather than high performance characteristics.

We claim:

1. A nuclear magnetic resonance magnetometer probe comprising:
    a single bottle containing a single radical solution having at least one electronic resonance at a predetermined frequency;
    a single radio frequency resonator formed around the bottle, the resonator having a resonance frequency tuned to the predetermined electronic resonance frequency;
    a single radio frequency generator connected to said resonator and exciting the resonator at the predetermined electronic resonance frequency;
    first and second windings surrounding the bottle and the resonator, said first and second windings being identical in shape and positioned facing one another, and being electrically connected in series to simultaneously excite the single radical solution; and
    a differential amplifier having two direct and reverse inputs respectively connected to the first and second windings.

2. The probe according to claim 1, wherein the first and second windings are in the same direction.

3. The probe according to claim 1, wherein the first and second windings are in opposite directions.

4. A nuclear magnetic resonance magnetometer probe, comprising:
    a single bottle means containing a single radical solution having at least one electronic resonance at a predetermined frequency;
    a single radio frequency resonator means formed around the bottle means, the resonator means having a resonance frequency tuned to the predetermined electronic resonance frequency;
    a single radio frequency generating means connected to said resonator means and exciting the resonator means at the predetermined electronic resonance frequency;
    first and second winding means surrounding the bottle means and the resonator means, said first and second winding means being identical in shape and positioned facing one another, and being electrically connected in series to simultaneously excite the single radical solution; and
    a differential amplifier means having two direct and reverse inputs respectively connected to the first and second winding means.

5. The probe according to claim 4, wherein the first and second winding means are in the same direction.

6. The probe according to claim 4, wherein the first and second winding means are in opposite directions.

* * * * *